(12) United States Patent
Lasser

(10) Patent No.: US 9,471,486 B2
(45) Date of Patent: Oct. 18, 2016

(54) REDUCING DISTURBANCES IN MEMORY CELLS

(71) Applicant: SANDISK 3D LLC, Milpitas, CA (US)

(72) Inventor: Menahem Lasser, Kohav-Yair (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 231 days.

(21) Appl. No.: 14/324,259

(22) Filed: Jul. 7, 2014

(65) Prior Publication Data

US 2016/0005495 A1 Jan. 7, 2016

(51) Int. Cl.
*G06F 12/02* (2006.01)
*G11C 16/34* (2006.01)
*G11C 29/04* (2006.01)

(52) U.S. Cl.
CPC ....... *G06F 12/0246* (2013.01); *G11C 16/3427* (2013.01); *G06F 2212/7204* (2013.01); *G11C 2029/0411* (2013.01)

(58) Field of Classification Search
CPC ... G06F 12/00; G06F 12/0238; G06F 3/0679
USPC ................. 711/100, 103, 154, 200
See application file for complete search history.

(56) References Cited

U.S. PATENT DOCUMENTS

| 6,292,868 | B1 | 9/2001 | Norman | |
|---|---|---|---|---|
| 6,563,745 | B1 | 5/2003 | Ilkbahar | |
| 2003/0046483 | A1* | 3/2003 | Moschopoulos | ... G06F 12/0246 711/103 |
| 2013/0003437 | A1* | 1/2013 | Siau | .................... G11C 11/5685 365/148 |

* cited by examiner

*Primary Examiner* — Tuan Thai
(74) *Attorney, Agent, or Firm* — Vierra Magen Marcus LLP

(57) ABSTRACT

Methods for reducing program disturb in non-volatile memories are described. In some embodiments, a non-volatile storage system may acquire a first set of intermediate data to be written to a plurality of memory cells, determine a current set of intermediate data written in the plurality of memory cells, determine whether to invert the first set of intermediate data based on the current set of intermediate data, invert the first set of intermediate data, and write the inverted first set of intermediate data to the plurality of memory cells. The memory cells that are already at the correct state may be skipped over and not programmed, thereby improving programming speed and reducing the cumulative voltage stress applied to unselected memory cells.

18 Claims, 18 Drawing Sheets

REDUCING DISTURBANCES IN MEMORY CELLS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics and increased susceptibility to write disturbs, in which data stored in non-targeted memory cells (or unselected memory cells) may be corrupted due to programming operations being performed on targeted memory cells (or memory cells that have been selected for programming).

DETAILED DESCRIPTION

Figure 1A:
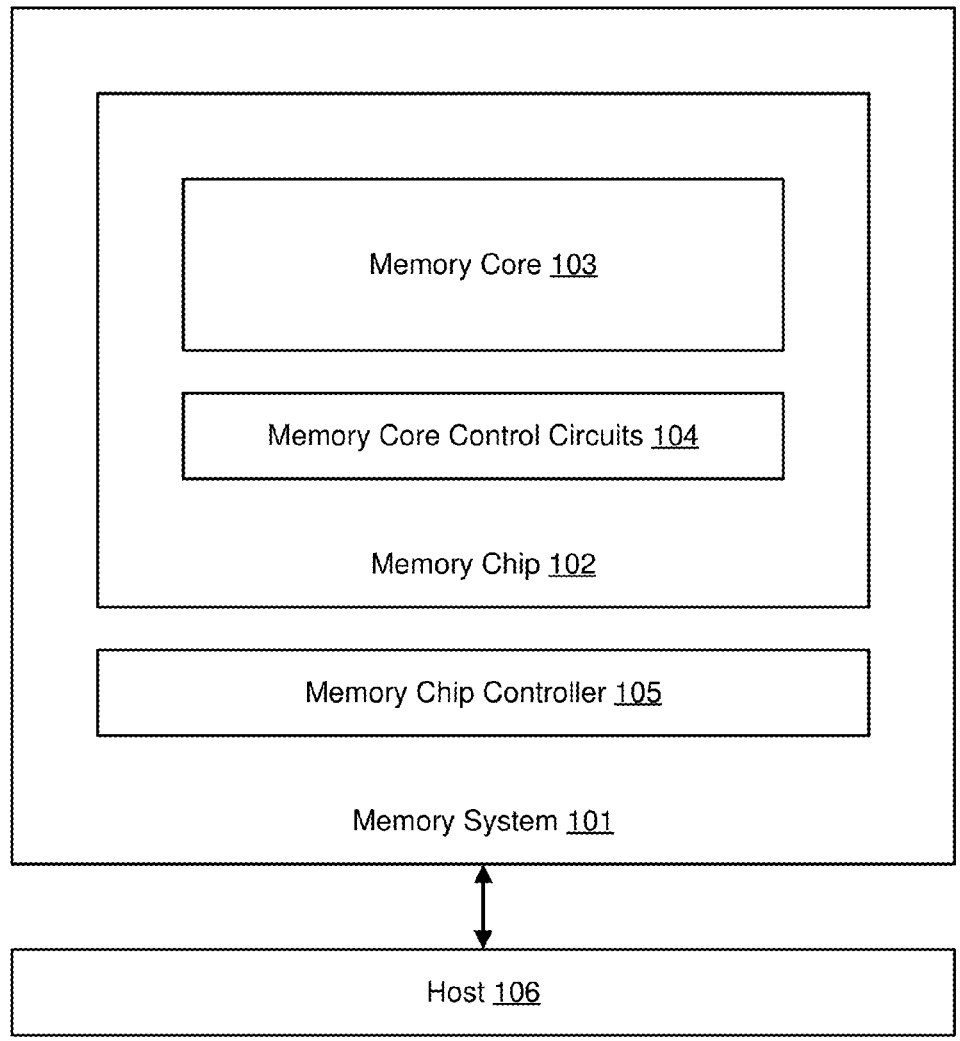
FIG. 1A depicts one embodiment of a memory system and a host.

Technology is described for reducing program disturb in non-volatile memories (e.g., ReRAM). During a programming operation, unselected memory cells (e.g., H cells, F cells, and U cells) may experience a voltage stress while a programming voltage is applied across selected memory cells. The voltage stress may cause an unselected memory cell's IV characteristics (e.g., memory cell resistance) to shift. Over many programming cycles, the accumulated shifting in memory cell IV characteristics may lead to data corruption. In some embodiments, a non-volatile storage system may acquire a first set of intermediate data to be written to a plurality of memory cells, determine a current set of intermediate data stored in the plurality of memory cells, determine whether to invert the first set of intermediate data based on the current set of intermediate data (e.g., if the number of memory cells that would change state would be reduced, if the average state change distance would be reduced, or the number of memory cells in a low resistance state would be reduced), invert the first set of intermediate data, and write the inverted first set of intermediate data to the plurality of memory cells. The memory cells that are already at the correct state may be skipped over and not programmed, thereby improving programming speed and reducing the cumulative voltage stress applied to unselected memory cells. In one example, the voltage stress applied to F cells over time may be reduced as a bit line that would have been selected for programming may instead apply an unselected bit line voltage rather than a selected bit line voltage.

In some embodiments, a non-volatile storage system may acquire a set of user-level data to be stored in a plurality of memory cells, determine a mapping between physical states of a memory cell and data values represented by the physical states based on a number of memory cells that will change state if the set of user-level data was stored in the plurality of memory cells according to the mapping, and store the set of user-level data in the plurality of memory cells according to the mapping. The set of user-level data may correspond with data that is input to the non-volatile storage system to be stored. The set of user-level data may be provided to the non-volatile storage system along with a write command to store the set of user-level data. In some cases, the set of user-level data may correspond with a portion of a file, a text file, an audio file, a video file, an image, or any other data that may be provided by an end user of the non-volatile storage system to be stored on the non-volatile storage system. In some cases, the non-volatile storage system may store the set of user-level data in the plurality of memory cells according to an arbitrary mapping between bits and memory cell states.

After the set of user-level data has been provided to the non-volatile storage system, the non-volatile storage system may generate a set of bit values associated with the set of user-level data and modify the set of bit values via a transformation prior to writing the modified set of bit values to memory. For the purpose of this disclosure, the term "intermediate data" may refer to any data that is derived from user data during the process of storing the user data, including the trivial derivation that generates intermediate data that is equal to the user data. In one embodiment, the transformation may include an identity transformation. In other embodiments, the transformation may take as input a first set of bit values and generate a second set of bit values that are different from the first set of bit values. One example of a transformation may include applying ECC to the first set of bit values to generate the second set of bit values. In some cases, a set of intermediate data may be derived from the set of user-level data by applying one or more transformations to a set of bit values associated with the set of user-level data. In one example, a set of user-level data may correspond with user data (e.g., a portion of an image) that is input to a non-volatile storage system to be stored therein and a set of intermediate data that is derived from the set of user-level data may correspond with bit values within the non-volatile storage system that were generated based on a transformation being applied to a set of bit values representing the set of user-level data. In some embodiments, a non-volatile storage system may acquire a first set of intermediate data derived from a set of user-level data input to the non-volatile storage system, determine a number of memory cells that will change state if the first set of intermediate data was written to a plurality of memory cells, invert the first set of intermediate data if the number of memory cells that will change state if the first set of intermediate data was written to the plurality of memory cells is greater than half of the plurality of memory cells, and write the inverted first set of intermediate data to the plurality of memory cells. In some cases, the non-volatile storage system may write the inverted first set of intermediate data to the plurality of memory cells using a direct programming which uses a hard-wired matching between bits and memory cell states.

In some embodiments, the number of memory cells that are skipped during a programming operation may be increased by increasing the number of memory cells that do not change state during the programming operation. This may be accomplished by altering the data to be written during the programming operation (e.g., by altering the coding scheme used to represent the data). In one example, a non-volatile storage system may determine whether to write a set of intermediate data to memory or to invert the set of intermediate data prior to writing the inverted set of intermediate data to memory based on a number of memory cells that would change state. The number of memory cells that would change state may be determined by XORing the set of intermediate data with the data already written to memory and counting the number of "1"s. If the number of memory cells that would change state is greater than half of the number of memory cells to be programmed, then the set of intermediate data may be inverted prior to programming the memory cells. Otherwise, if the number of memory cells that would change state is not greater than half of the number of memory cells to be programmed, then the set of intermediate data may be written to the memory cells without being inverted first. In some cases, the number of memory cells that may skip programming may be determined by XORing the set of intermediate data with the data already stored and counting the number of "0"s. In this case, if the number of memory cells that may skip programming is less than half of the number of memory cells, then the set of intermediate data may be inverted prior to programming the memory cells. In some cases, by limiting the upper bound on the number of memory cells to be programmed to be half the number of memory cells to be programmed, the number of write cycles to neighboring pages of a page before the page must be refreshed may be increased.

In one example, if previously written data stored at a target address comprises "00100111" and the data to be written comprises "11011111," then if the data to be written is left unaltered, then there will be five memory cells that require a state change. However, if the data to be written is inverted to be "00100000," then the number of memory cells that require a state change will be three memory cells. In this case, inverting the data prior to programming would reduce the number of memory cells changing state by two. If the data to be written cannot be altered prior to programming, then in the worst case every memory cell may require a state change. However, if data inversions are permitted, then in the worst case only half of the memory cells may require a state change (i.e., if more than half of the memory cells require a state change, then the data may be inverted prior to programming the memory cells).

In some cases, a flag bit may be set or stored to identify that a set of data has been inverted. A flag bit may be stored per page, per a set of pages (e.g., covering two pages), or per portion of a page (e.g., half a page). The flag bit may be written to a memory core, such as memory core 103 in FIG. 1A, or stored in non-volatile memory within a controller, such as memory chip controller 105 in FIG. 1A. In one embodiment, a plurality of flag bits may be stored in a centralized table stored within a memory core. In another embodiment, one or more flag bits may be stored per page within the sideband or overhead area located at the end of a page (e.g., within an additional 16 bytes appended to each page). In one example, the sideband area for a particular page may store four flags corresponding with four portions of the particular page (e.g., corresponding with four equal parts of the page). Redundant flags may be used to protect a flag bit from data errors that occur during transmission or storage of the flag bit (e.g., a majority vote of three flag bits may be used for determining the value of a particular flag bit).

In some embodiments, a non-volatile storage system may determine whether to write a set of intermediate data to memory or to invert the set of intermediate data prior to writing the set of intermediate data to memory based on the average state change distance that the memory cells would have to move during a programming operation. In one example, each memory cell of a set of memory cells may comprise a multi-level memory cell that stores four states. Each memory cell may be placed into one or four different resistance states (e.g., "00" may correspond with the lowest resistance state, "01" may correspond with the resistance state above the lowest resistance state, "11" may correspond with the resistance state below the highest resistance state, "10" may correspond with the highest resistance state). In this case, the state change distance between the lowest resistance state and the highest resistance state is the greatest state distance (i.e., they are separated by two states or a state distance of three, while the distance between the resistance state above the lowest resistance state and the resistance state below the highest resistance state are only a single state distance apart). The average state change distance may be determined by calculating the state change distance required for each of the memory cells, adding the distances together, and then dividing by the total number of memory cells to be programmed. In one example, if a plurality of memory cells comprised eight 2-bit per cell memory cells and writing a first set of intermediate data into the plurality of memory cells would cause two of the memory cells to move from the lowest resistance state to the highest resistance state, two of the memory cells to not change state, and four of the memory cells to move from the resistance state below the highest resistance state to the resistance state above the lowest resistance state, then the average state change distance would be $(3*2+0*2+1*4)/8=1.25$. The average state change distance may be determined for both a given set of intermediate data and the inverse of the set of intermediate data. If the average state change distance is lower if the set of intermediate data is inverted, then the set of intermediate data may be inverted prior to programming the set of intermediate data.

In one embodiment, a data transformation may be dynamically selected prior to performing a programming operation based on the number of memory cells to be placed into the lowest resistance state. As the lowest resistance state may correspond with the highest leakage current, minimizing the number of memory cells being programmed into the lowest resistance state may reduce the amount of leakage current.

In another embodiment, a data transformation may be dynamically selected prior to performing a programming operation by jointly optimizing both the number of memory cells to be placed into the lowest resistance state and the number of memory cells that would change state during the programming operation. In one example, a cost function that weighs both the number of memory cells switching and the number of memory cells to be programmed into the lowest resistance state may be minimized. In another example, a conversion factor that indicates the relative impact between the two effects may be used (e.g., the benefit of reducing the number of memory cells changing state by one may be equivalent to the benefit of reducing the number of memory cells in the lowest resistance state by three). In this case, if a set of data to be programmed would result in 60% of the memory cells changing state and 30% of the memory cells being programmed to the lowest resistance state (which, for memory cells that store only two resistance states, implies that inverting the set of data would result in 40% of the memory cells changing state and 70% of the memory cells being programmed to the lowest resistance state), then the trade-off is between an additional 20% of the memory cells changing state or an additional 40% of the memory cells reaching the lowest resistance (or the highest leakage current) state. If the conversion factor is three, then the disadvantage of an additional 40% of the memory cells being programmed to the lowest resistance state is not enough to offset the advantage of not having to program an additional 20% of the memory cells. Thus, with a conversion factor of three, inverting the set of data prior to programming may be the preferred data transformation.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device). In some cases, the memory system 101 may be embedded within the host 106. In other cases, the memory system 101 may comprise a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip. The memory chip controller 105 and memory chip may be arranged on a single integrated circuit. In other embodiments, memory chip controller and memory chip may be arranged on different integrated circuits. In some cases, the memory chip controller 105 and memory chip 102 may be integrated on a system board, logic board, or a PCB.

The memory chip 02 includes memory core control circuits 104 and a memory core 03. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
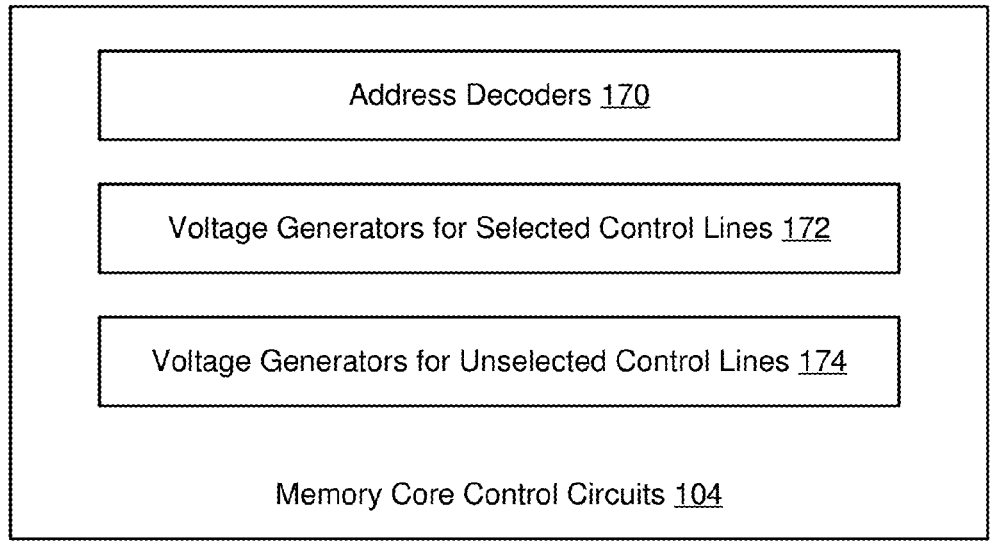
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
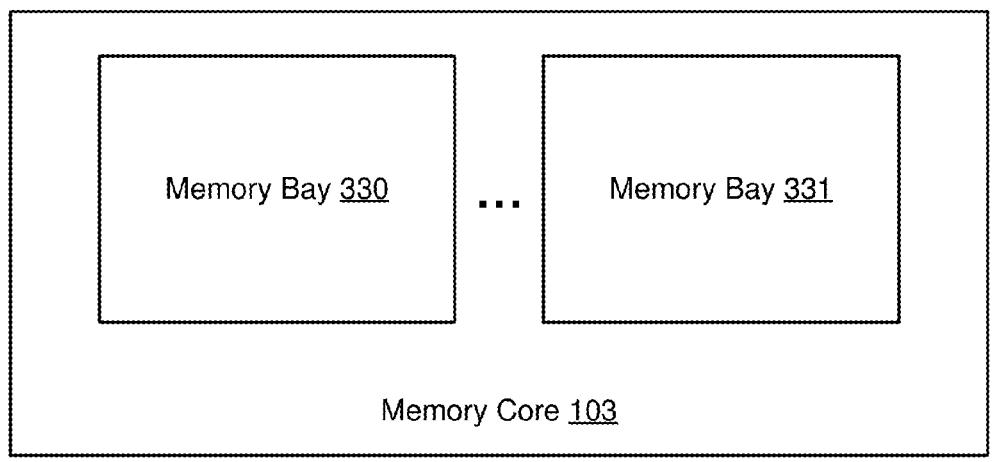
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
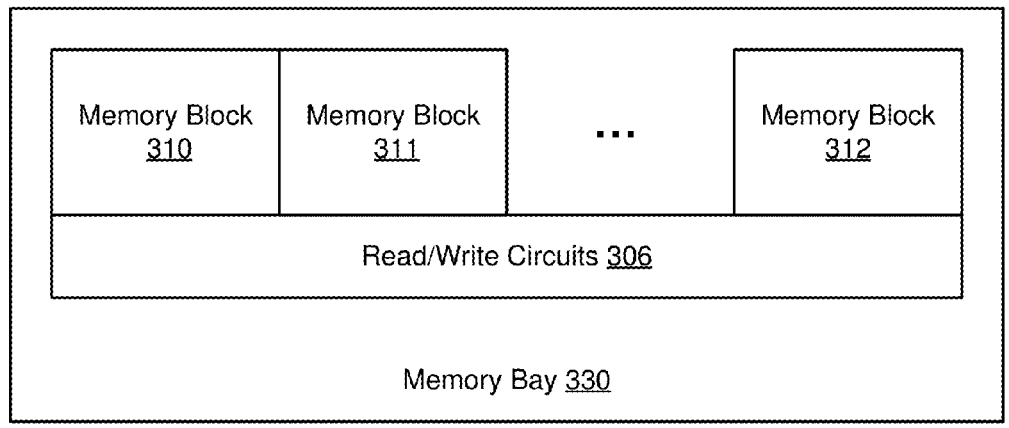
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
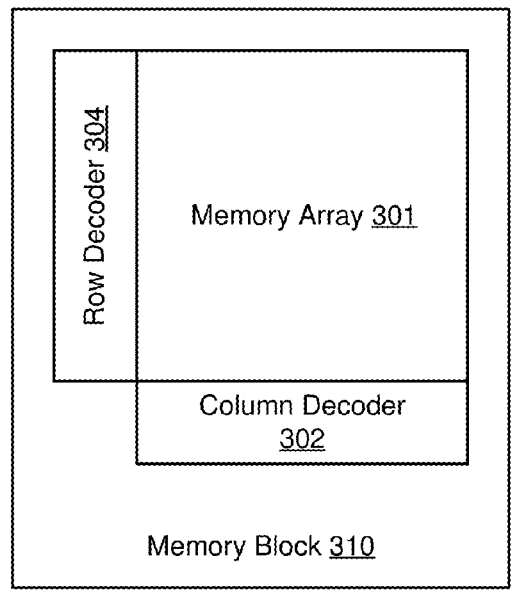
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
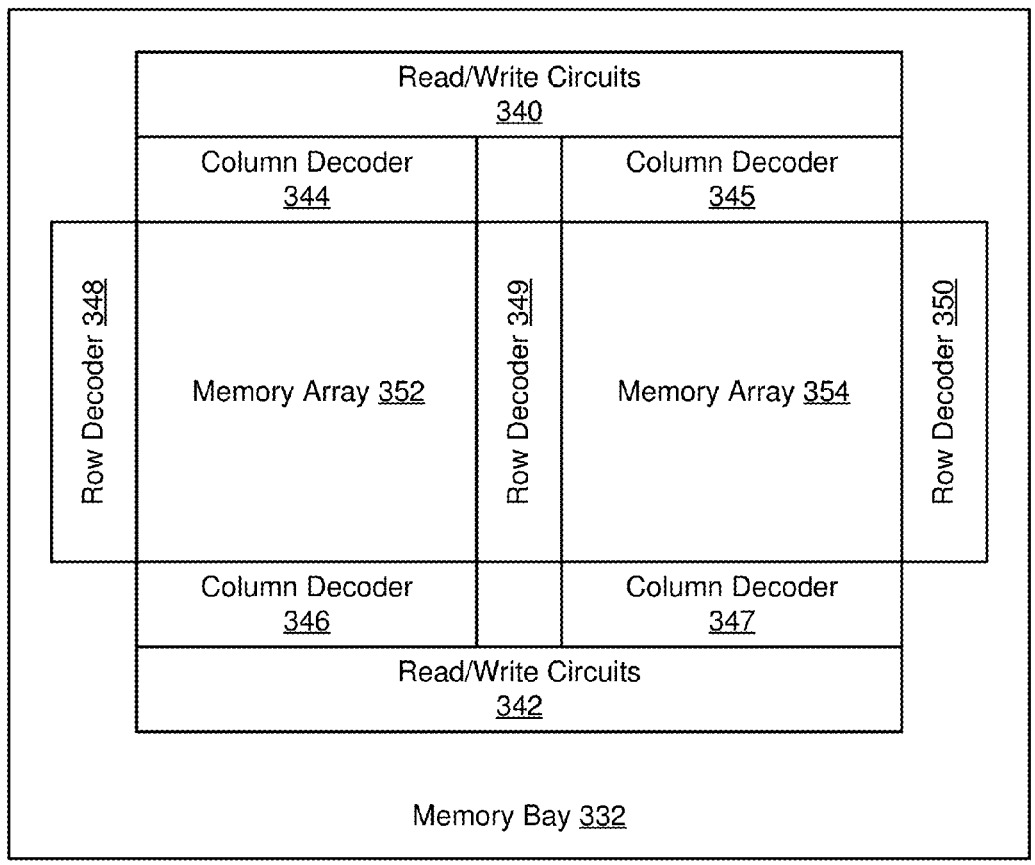
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
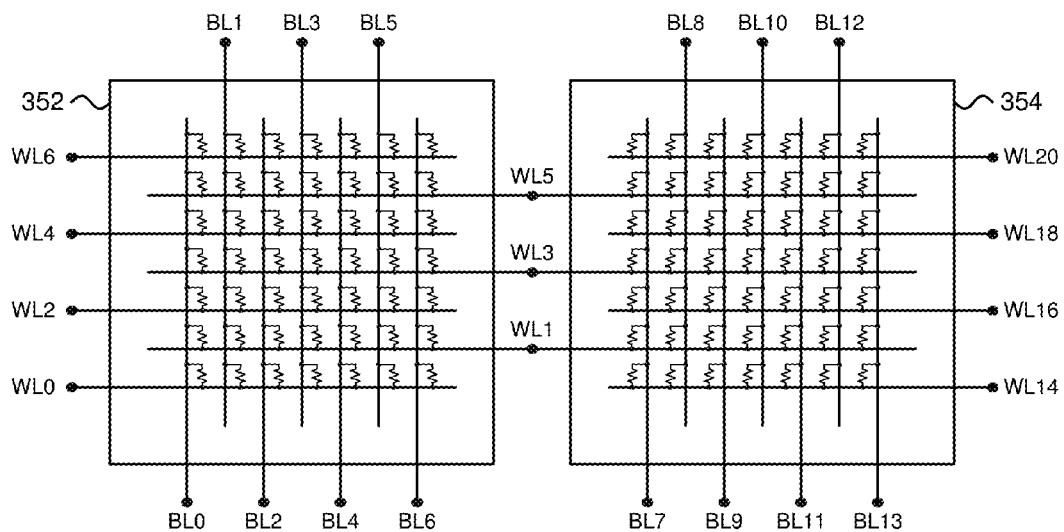
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate).

Figure 2B:
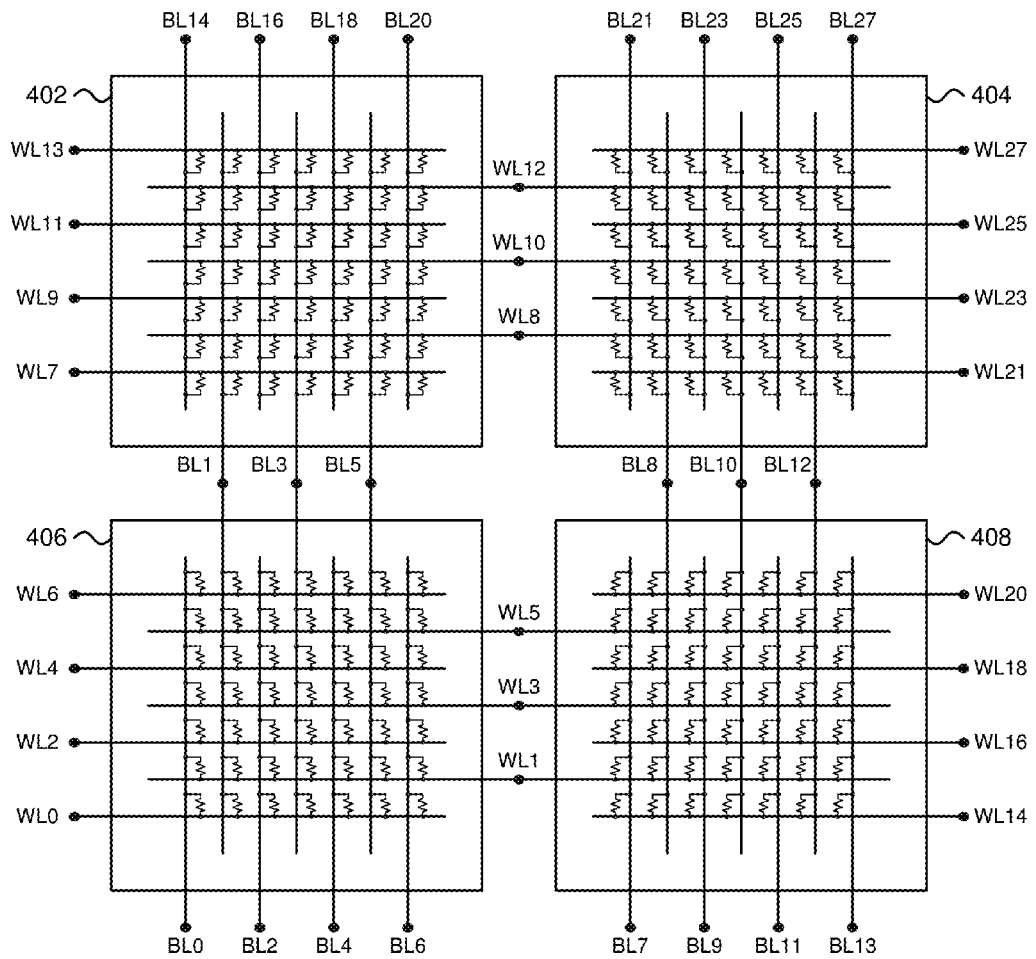
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
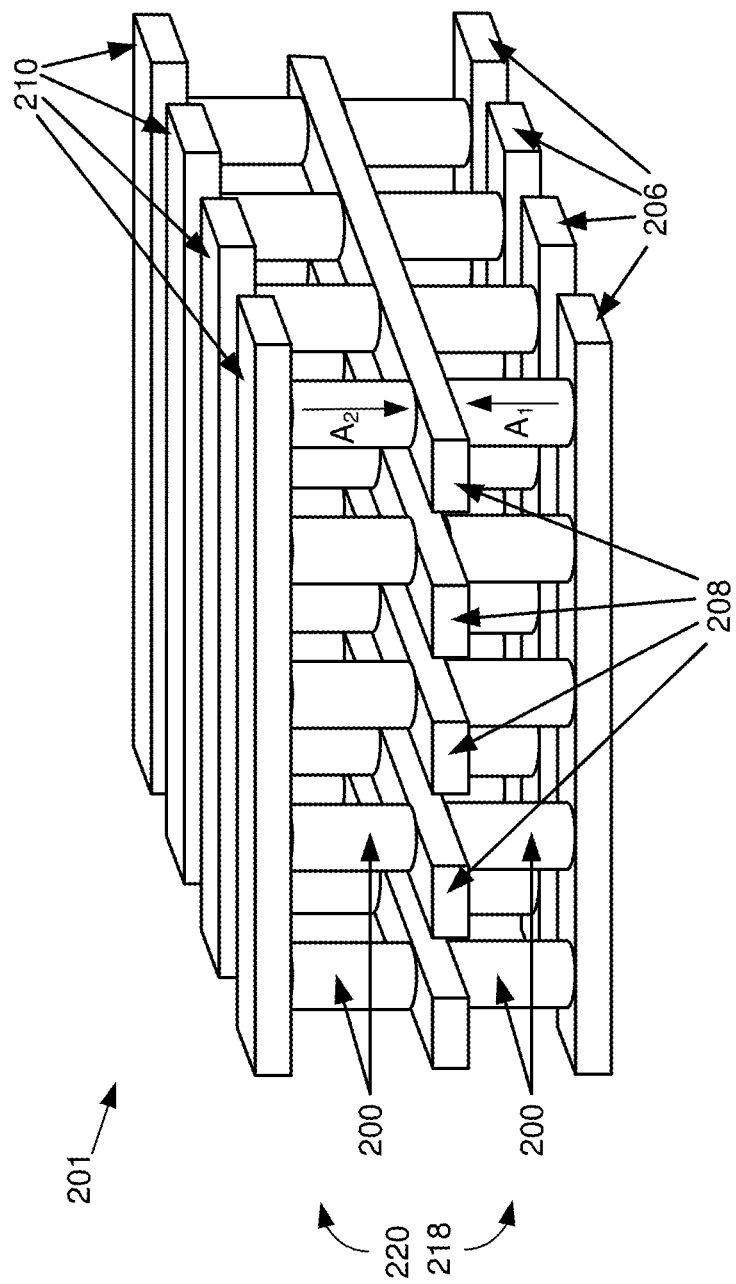
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET may require a higher than normal programming voltage and may be referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
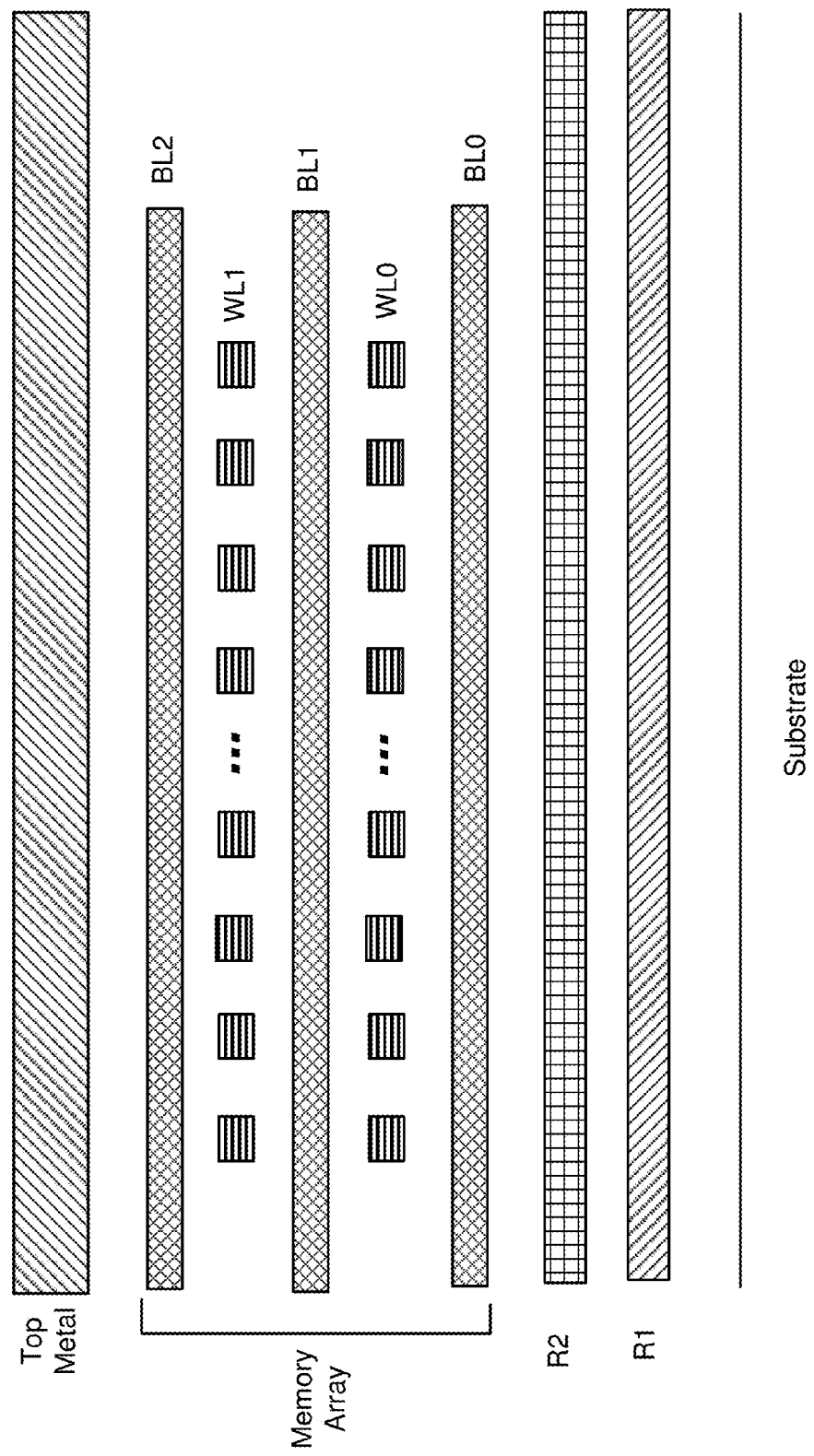
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
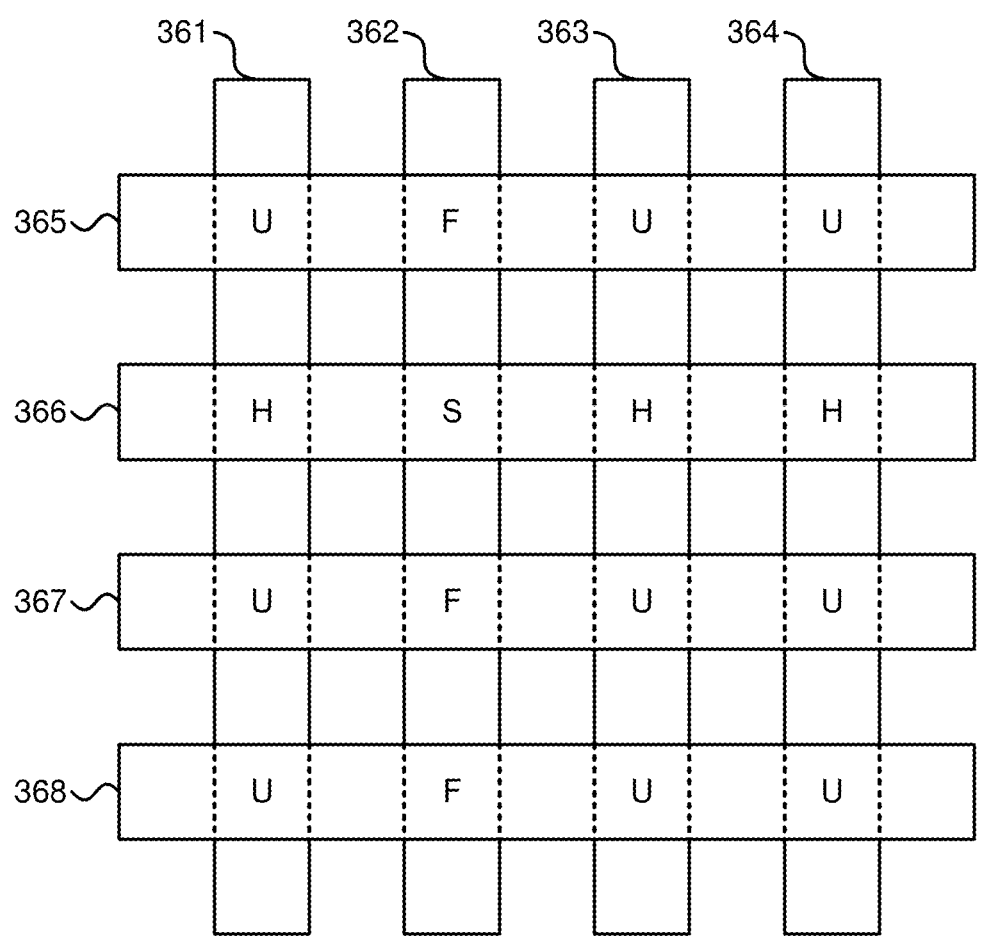
FIGS. 3C-3D depicts various embodiments of a cross-point memory array.

FIG. 3C depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
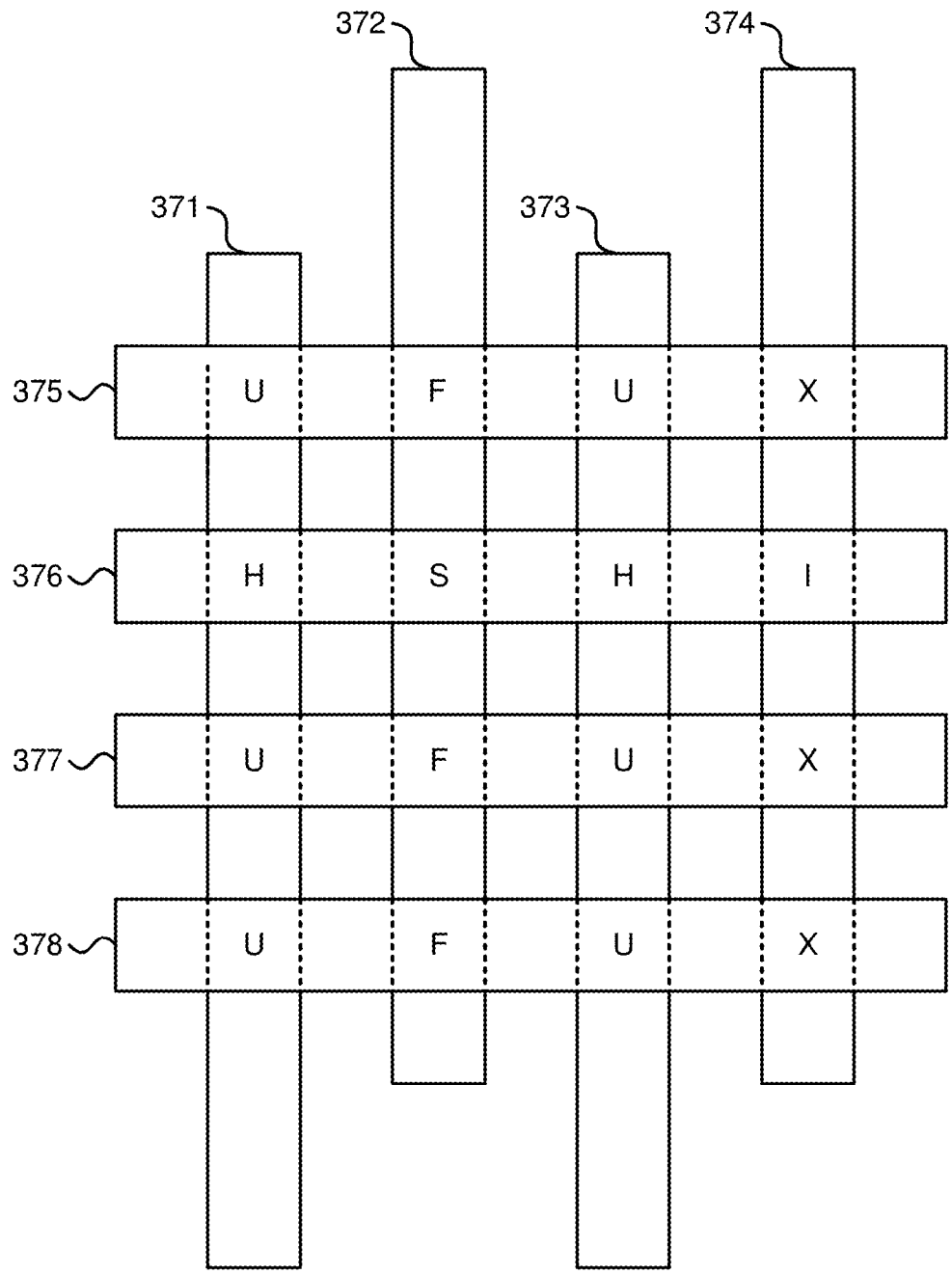

FIG. 3D depicts an alternative embodiment of a cross-point memory array 370. The cross-point memory array 370 may correspond with memory array 201 in FIG. 3A. As depicted, cross-point memory array 370 includes word lines 375-378 and bit lines 371-374. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines. More information regarding vertical bit line three dimensional memory arrays may be found in U.S. Provisional Application 61/526,764, "Optimized Architecture for Three Dimensional Non-Volatile Storage Device with Vertical Bit Lines" and U.S. patent application Ser. No. 13/323, 573, "Three Dimensional Non-Volatile Storage with Multi Block Row Selection."

Figure 4A:
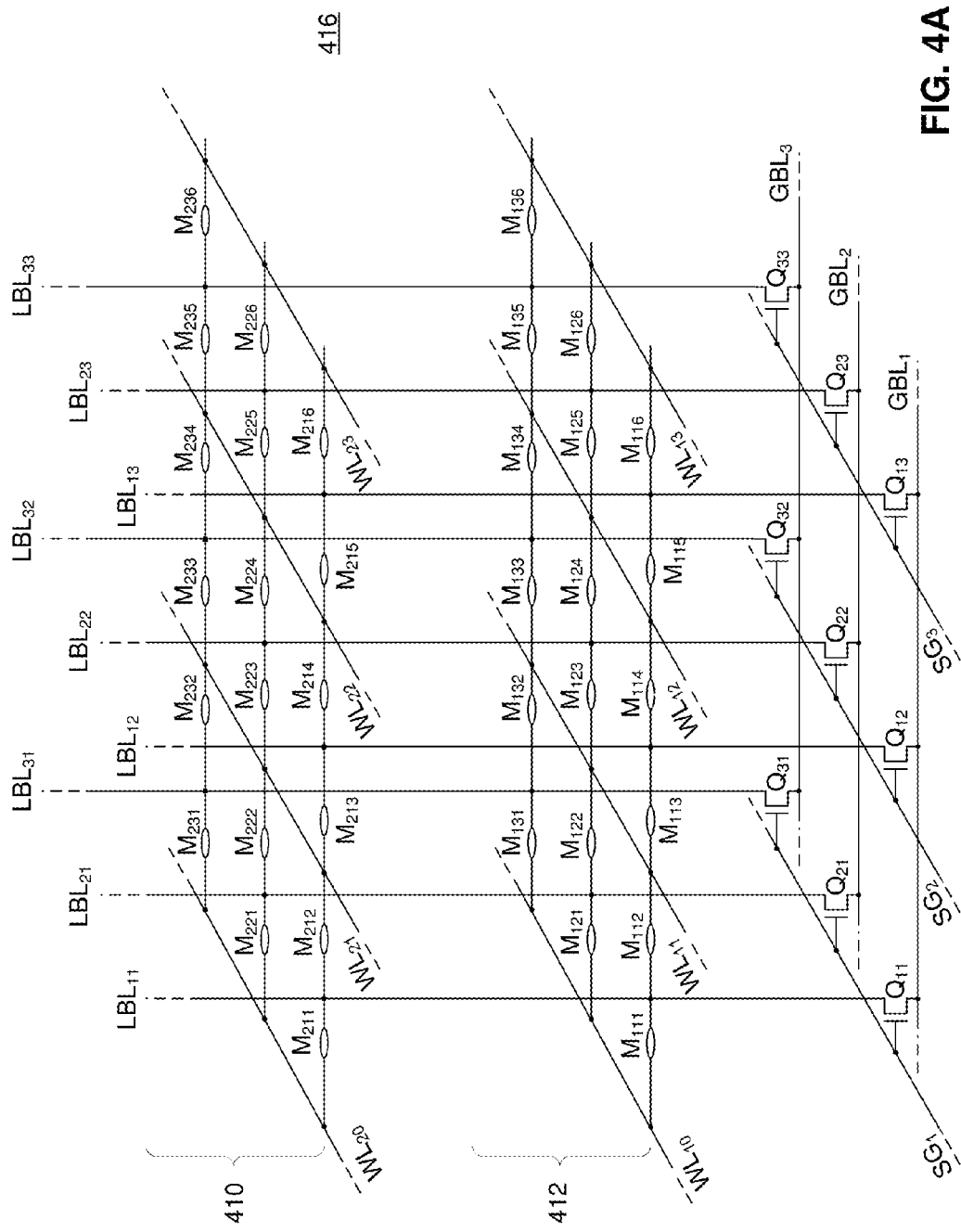
FIG. 4A depicts one embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The particular memory cell may comprise a floating gate device or a charge trap device (e.g., using a silicon nitride material). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
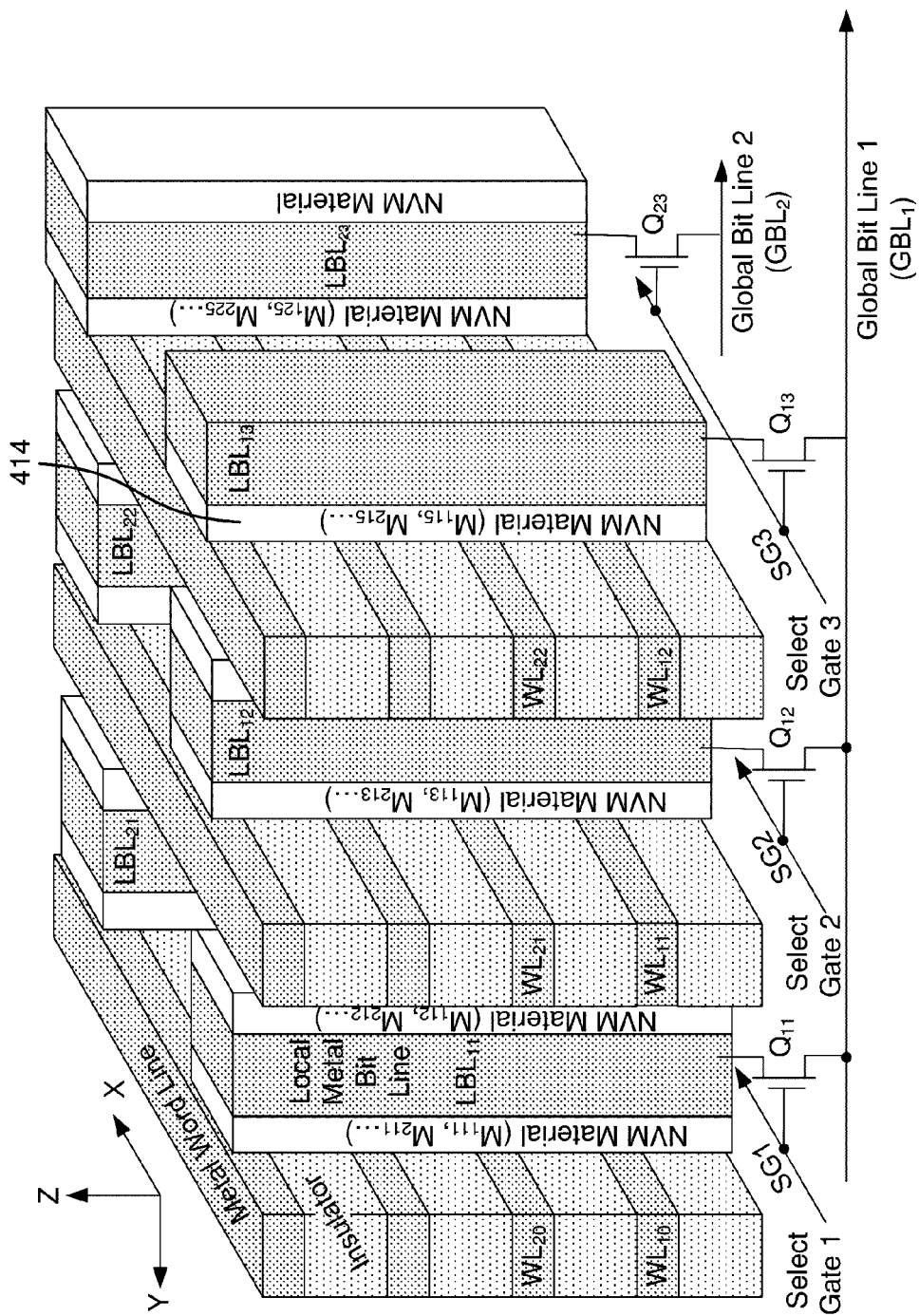
FIG. 4B depicts one embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical TFT.

More information regarding the structure and operation of vertical bit line memory arrays may be found in U.S. Provisional Application 61/423,007, entitled "Non-Volatile Memory Having 3D Array of Read/Write Elements With Vertical Bit Lines and Laterally Aligned Active Elements and Methods Thereof" and U.S. patent application Ser. No. 13/323,703, entitled "Three Dimensional Non-Volatile Storage with Three Device Driver for Row Select."

Figure 5A:
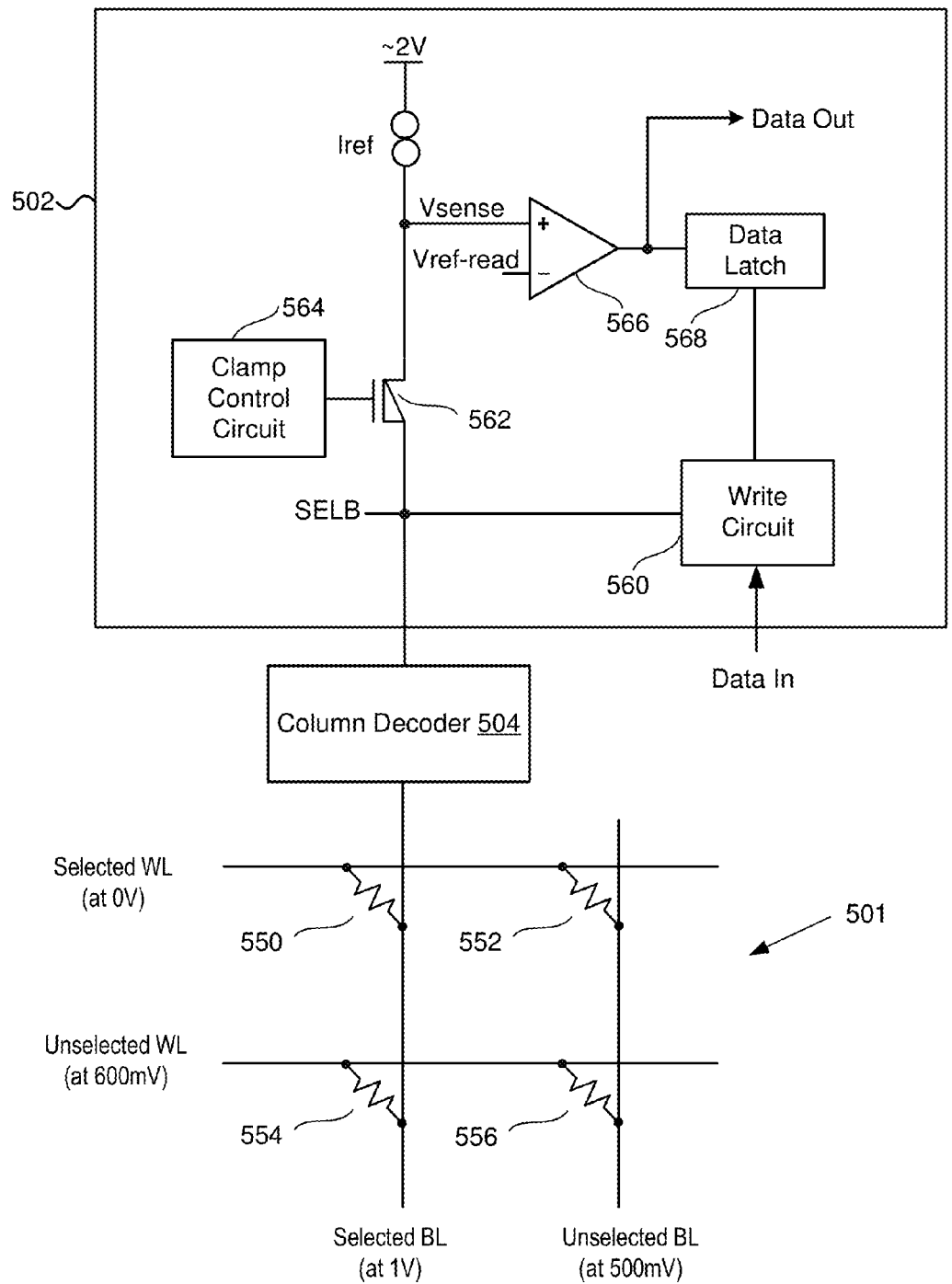
FIG. 5A depicts one embodiment of a read/write circuit along with a portion of a memory array.

FIG. 5A depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5A may be reversed such that the selected bit line is biased to 0V, the unselected word line is biased to 0.4V, the selected word line is biased to 1V, and the unselected bit line is biased to 0.5V.

As depicted in FIG. 5A, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). More information regarding write circuits that can sense while programming data can be found in U.S. Pat. No. 6,574,145, "Memory Device and Method for Sensing While Programming a Non-Volatile Memory Cell." If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 5B:
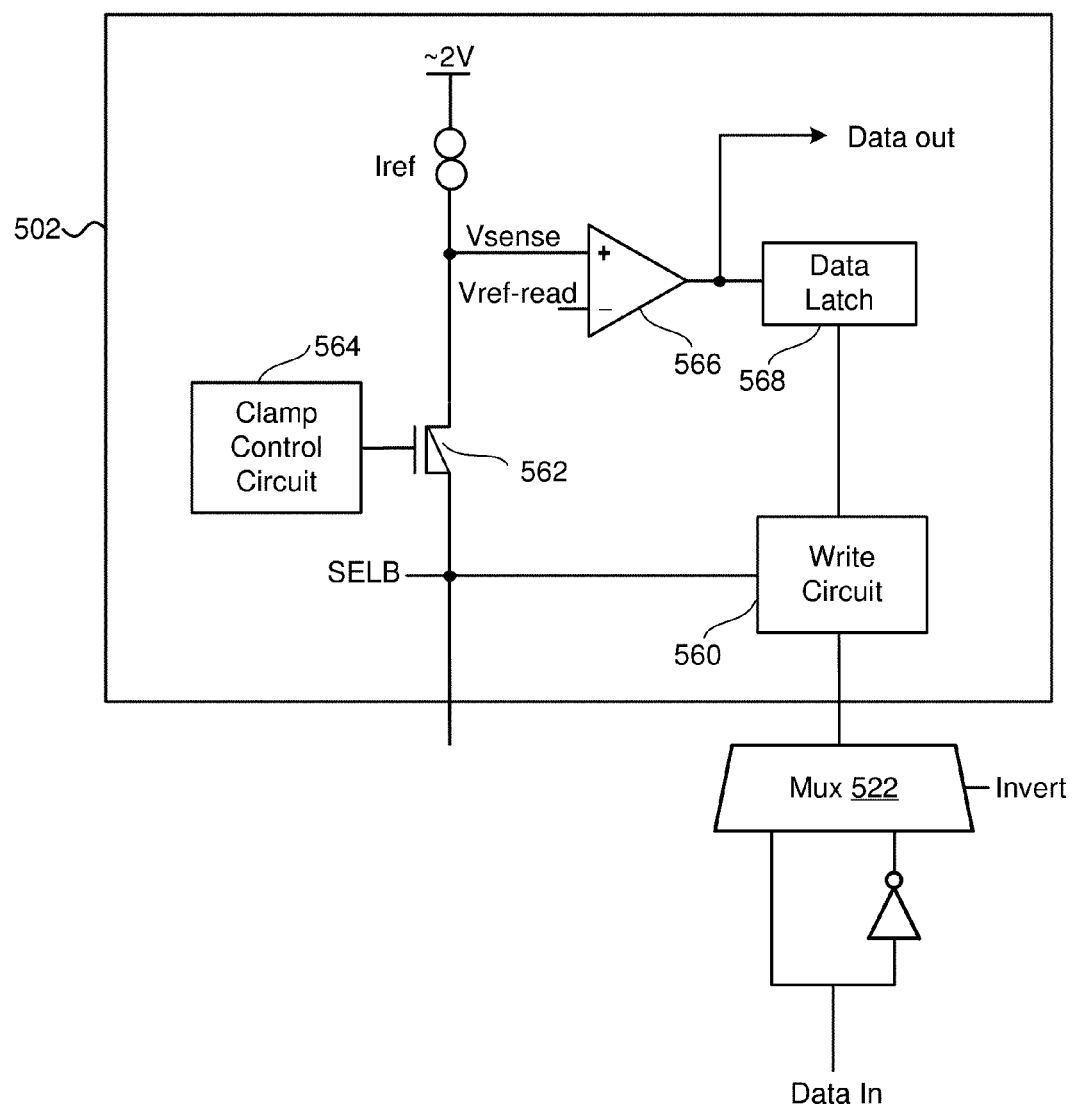
FIG. 5B depicts one embodiment of a read/write circuit and data inversion logic that may selectively invert the input data.

FIG. 5B depicts one embodiment of a read/write circuit 502 and data inversion logic that may selectively invert the input data (Data In). Read/write circuit 502 is one example of an implementation of read/write circuit 306 in FIG. 1D. The data inversion logic includes a multiplexor (MUX 522) and an inverter. As depicted, an inversion signal (Invert) may be used to select between writing the data value of Data In or the inverted data value of Data In. In some cases, the inversion signal may be generated by a memory core control circuit, such as memory core control circuits 105 in FIG. 1A, or a controller located on the memory system, such as memory chip controller 105 in FIG. 1A.

Figure 6A:
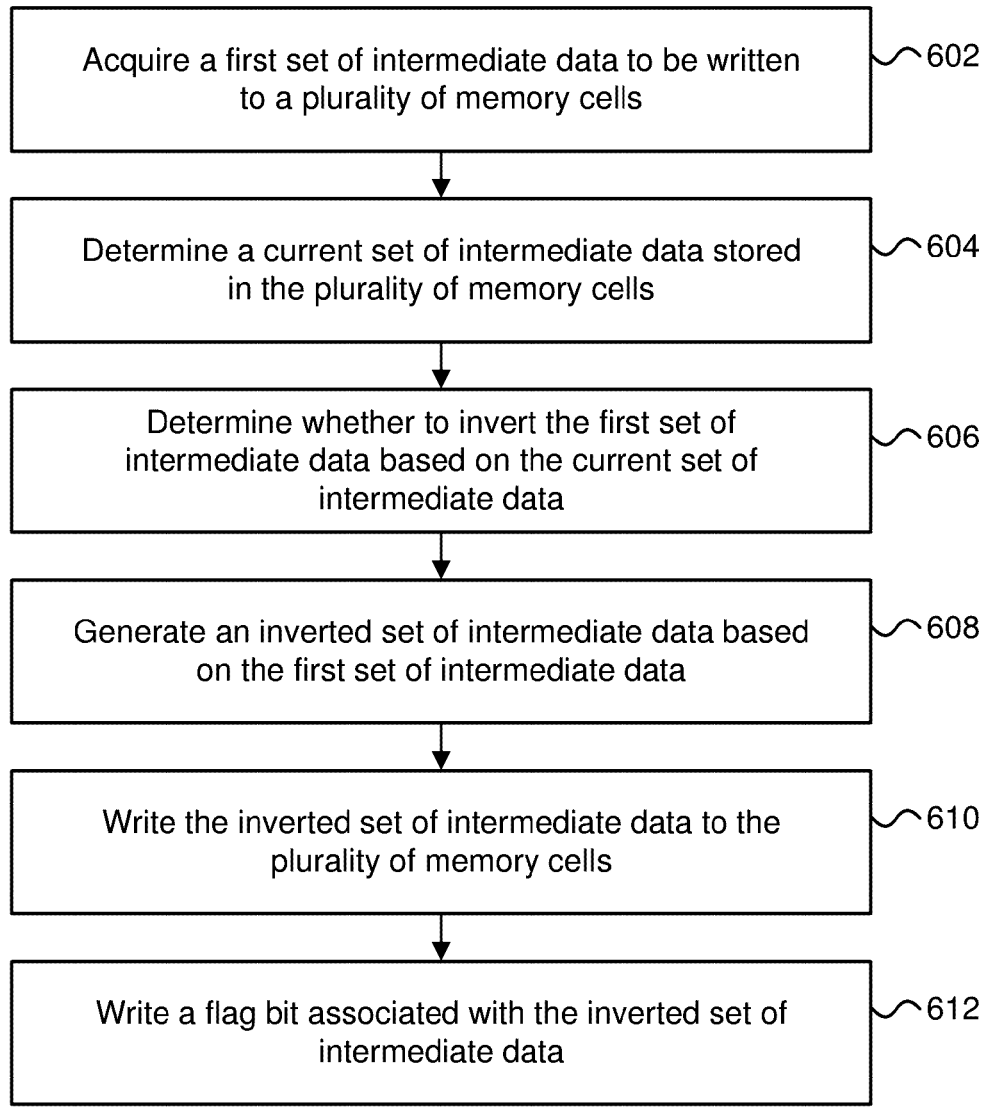
FIG. 6A is a flowchart describing one embodiment of a process for performing a programming operation.

FIG. 6A is a flowchart describing one embodiment of a process for performing a programming operation. In one embodiment, the process of FIG. 6A may be performed by a memory system, such as memory system 101 in FIG. 1A.

In step 602, a first set of intermediate data to be written to a plurality of memory cells is acquired. The first set of intermediate data may be derived from a set of user-level data. The set of user-level data may be provided to a non-volatile storage system via a write command to the non-volatile storage system to program the set of user-level data to a target address. The first set of intermediate data may correspond with a page of data (e.g., 512B of data or 1024B of data) or a portion of a page of data (e.g., a byte of data). The plurality of memory cells may be part of a memory array, such as memory array 301 in FIG. 1E.

In step 604, a current set of intermediate data stored in the plurality of memory cells is determined. The current set of intermediate data may be acquired by reading the plurality of memory cells. In some cases, a current flag bit associated with whether the data currently stored in the plurality of memory cells has been inverted may be read from sideband information associated with the plurality of memory cells. The current set of intermediate data may be read during a read-before-write operation performed prior to programming the first set of intermediate data to the plurality of memory cells.

In step 606, it is determined whether to invert the first set of intermediate data based on the current set of intermediate data. In one example, the first set of intermediate data may be XORed with the current set of intermediate data and the number of "1"s may be summed to determine a number of memory cells that would change state that is required to program the first set of intermediate data into the plurality of memory cells. If the number of memory cells that would change state is greater than half of the plurality of memory cells, then the first set of intermediate data may be inverted to reduce the number of memory cells that would change state during programming of the first set of intermediate data. In another example, if the plurality of memory cells comprise multi-level memory cells, then an average state change distance may be determined given that the first set of intermediate data is written to the plurality of memory cells. A second average state change distance may then be computed assuming that the first set of intermediate data is inverted prior to being programmed into the plurality of memory cells. If the second average state change distance is less than the first average state change distance, then the first set of intermediate data may be inverted prior to being programmed into the plurality of memory cells.

In some embodiments, the determination of whether to invert the first set of intermediate data may depend on a weighted combination of the number of memory cells that would change state and the number of memory cells to be placed into the lowest resistance state (or one or more of the lowest resistance states). In one example, the number of memory cells that would change state may be determined by comparing the first set of intermediate data with the current set of intermediate data (e.g., comparing the first set of intermediate data with the current set of intermediate data to determine the number of memory cells that would transition from either a "0" to a "1" or from a "1" to a "0") and the number of memory cells to be placed into the lowest resistance state may be determined by counting the number of "1"s in the data to be written if the number of "1"s corresponds with the lowest resistance state (or the number of "0"s if the number of "0"s corresponds with the lowest resistance state).

In some cases, a cost function that weighs both the number of memory cells switching and the number of memory cells to be programmed into the lowest resistance state may be minimized. In one example, a conversion factor that indicates the relative impact between the two effects may be used (e.g., the benefit of reducing the number of memory cells changing state by one may be equivalent to the benefit of reducing the number of memory cells in the lowest resistance state by three). In this case, if a set of intermediate data to be programmed would result in 60% of the memory cells changing state and 30% of the memory cells being programmed to the lowest resistance state (which, for memory cells that store only two resistance states, implies that inverting the set of data would result in 40% of the memory cells changing state and 70% of the memory cells being programmed to the lowest resistance state), then the trade-off is between an additional 20% of the memory cells changing state or an additional 40% of the memory cells reaching the lowest resistance (or the highest leakage current) state. If the conversion factor is three, then the disadvantage of an additional 40% of the memory cells being programmed to the lowest resistance state is not enough to offset the advantage of not having to program an additional 20% of the memory cells. Thus, with a conversion factor of three, inverting the set of intermediate data prior to programming may be the preferred data transformation.

In one embodiment, the plurality of memory cells may correspond with memory cells within a memory array. If the number of memory cells within the memory array that have been programmed into a low resistance state is greater than a threshold (e.g., more than 20% of the memory cells within the memory array), then the determination of whether to invert the first set of intermediate data may depend on the weighted combination of the number of memory cells that would change state and the number of memory cells to be placed into the lowest resistance state (or the state corresponding with the highest leakage current). Otherwise, if the number of memory cells within the memory array that have been programmed into a low resistance state is not greater than a threshold, then the determination of whether to invert the first set of intermediate data may depend on minimizing the number of memory cells that would change state.

Various embodiments of processes for determining whether to invert the first set of intermediate data prior to programming the first set of intermediate data are described later in reference to FIGS. 6C-6D.

In step 608, an inverted set of intermediate data is generated based on the first set of intermediate data. In one embodiment, the inverted set of intermediate data may be generated using data inversion logic, such as the data conversion logic including a multiplexor depicted in FIG. 5B. In step 610, the inverted set of intermediate data is written to the plurality of memory cells. In one embodiment, memory cells making a transition from a low resistance state to a high resistance state may be programmed during a first programming operation and memory cells making a transition from the high resistance state to the low resistance state may be programmed during a second programming operation subsequent to the first programming operation. In another embodiment, memory cells being programmed from a first state (e.g., associated with a "0") to a second state (e.g., associated with a "1") may be programmed during a first programming operation and memory cells being programmed from the second state to the first state may be programmed during a second programming operation subsequent to the first programming operation.

In step 612, a flag bit associated with the inverted set of intermediate data is written. In the case that the plurality of memory cells corresponds with a page of data or a portion of a page of data, then the flag bit may be written into a sideband area associated with the page of data. In one example, a 512B page may be partitioned into eight portions, with each portion including 64B of data. Each portion of the page of data may correspond with a particular flag bit, which may be read to determine whether the data stored within the portion of the page of data has been inverted or has not been inverted. In some cases, a page of data may include a first portion in which the data stored has been inverted and a second portion in which the data stored has not been inverted.

Figure 6B:
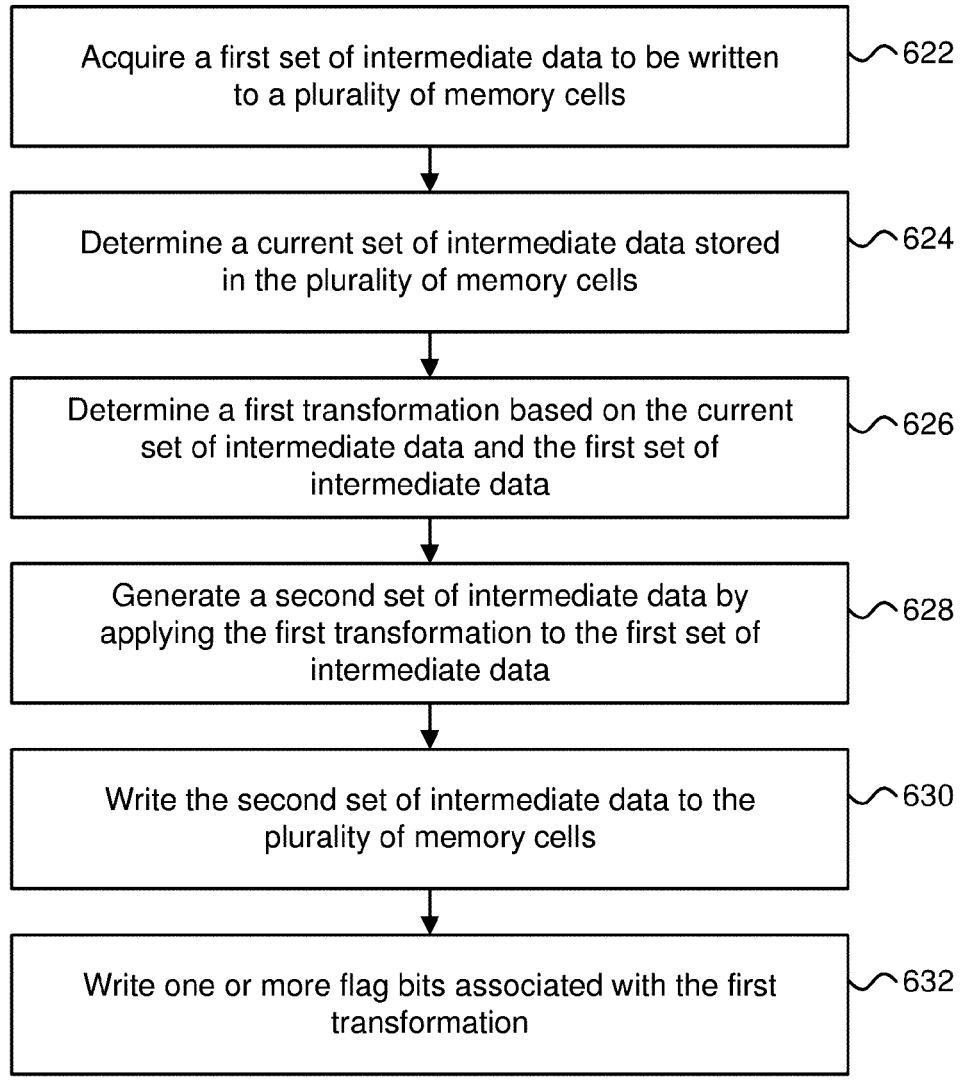
FIG. 6B is a flowchart describing an alternative embodiment of a process for performing a programming operation.

FIG. 6B is a flowchart describing an alternative embodiment of a process for performing a programming operation. In one embodiment, the process of FIG. 6B may be performed by a memory system, such as memory system 101 in FIG. 1A.

In step 622, a first set of intermediate data to be written to a plurality of memory cells is acquired. The first set of intermediate data may be derived from a set of user-level data. The set of user-level data may be provided to a non-volatile storage system via a write command to the non-volatile storage system to program the set of user-level data to a target address. The first set of intermediate data may correspond with a page of data (e.g., 512B of data or 1024B of data) or a portion of a page of data (e.g., a byte of data). The plurality of memory cells may be part of a memory array, such as memory array 301 in FIG. 1E.

In step 624, a current set of intermediate data stored in the plurality of memory cells is determined. The current set of intermediate data may be acquired by reading the plurality of memory cells. In some cases, a current flag bit associated with whether the data currently stored in the plurality of memory cells has been inverted may be read from sideband information associated with the plurality of memory cells. The current set of intermediate data may be read during a read-before-write operation performed prior to programming the first set of intermediate data to the plurality of memory cells.

In step 626, a first transformation is determined based on the current set of intermediate data and the first set of intermediate data. In some cases, the first transformation may be determined based on the first set of intermediate data, the current set of intermediate data, and a current flag bit associated with the current set of intermediate data (i.e., that determines whether the current set of intermediate data is associated with previously inverted data).

In the case that the plurality of memory cells comprise binary memory cells and/or are not used to store more than two programming states per memory cell, the first transformation may correspond with inverting the first set of intermediate data. In one embodiment, the first set of intermediate data may be XORed with the current set of intermediate data and the number of "1"s may be summed to determine a number of memory cells what would change state that is required to program the first set of intermediate data into the plurality of memory cells. If the number of memory cells that would change state is greater than half of the plurality of memory cells, then the first set of intermediate data may be inverted to reduce the number of memory cells that would change state during programming. In another embodiment, if the plurality of memory cells comprise multi-level memory cells, then an average state change distance may be determined given that the first set of intermediate data is written to the plurality of memory cells. A second average state change distance may then be determined assuming that the first set of intermediate data is inverted prior to being programmed into the plurality of memory cells. If the second average state change distance is less than the first average state change distance, then the first set of intermediate data may be inverted prior to being programmed into the plurality of memory cells.

In the case that the plurality of memory cells comprise multi-level memory cells, then one of a number of different mappings corresponding with different programming state assignments may be applied. In one example, a first mapping may correspond with "00" being assigned to the lowest resistance state, "01" being assigned to the resistance state above the lowest resistance state, "11" being assigned to the resistance state below the highest resistance state, and "10" being assigned to the highest resistance state. In another example, a second mapping may correspond with "00" being assigned to the lowest resistance state, "01" being assigned to the resistance state above the lowest resistance state, "10" being assigned to the resistance state below the highest resistance state, and "11" being assigned to the highest resistance state.

In some embodiments, the first transformation may correspond with inverting the first set of intermediate data and the determination of whether to invert the first set of intermediate data may depend on a weighted combination of the number of memory cells that would change state and the number of memory cells to be placed into the lowest resistance state (or one or more of the lowest resistance states). In one example, a cost function that weighs both the number of memory cells switching and the number of memory cells to be programmed into the lowest resistance state may be minimized. In another example, a conversion factor that specifies the relative importance between the two effects may be used (e.g., the benefit of reducing the number of memory cells changing state by one may be equivalent to the benefit of reducing the number of memory cells in the lowest resistance state by three). In this case, if a set of data to be programmed would result in 60% of the memory cells changing state and 30% of the memory cells being programmed to the lowest resistance state (which, for memory cells that store only two resistance states, implies that inverting the set of data would result in 40% of the memory cells changing state and 70% of the memory cells being programmed to the lowest resistance state), then the trade-off is between an additional 20% of the memory cells changing state or an additional 40% of the memory cells reaching the lowest resistance (or the highest leakage current) state. If the conversion factor is three, then the disadvantage of an additional 40% of the memory cells being programmed to the lowest resistance state is not enough to offset the advantage of not having to program an additional 20% of the memory cells. Thus, with a conversion factor of three, inverting the set of data prior to programming may be the selected data transformation.

Various embodiments of processes for determining whether to apply a transformation to the first set of intermediate data prior to programming are described later in reference to FIGS. 6C-6D.

In step 628, a second set of intermediate data is generated based on the first set of intermediate data. The second set of intermediate data may be generated by applying the first transformation to the first set of intermediate data. In one embodiment, the second set of intermediate data may be generated using data inversion logic, such as the data conversion logic including a multiplexor depicted in FIG. 5B. In step 630, the second set of intermediate data is written to the plurality of memory cells. In step 632, one or more flag bits associated with the first transformation are written. In the case that the plurality of memory cells corresponds with a page of data or a portion of a page of data), then the one or more flag bits may be written into a sideband area associated with the page of data. In one example, a 1024B page may be partitioned into four portions, with each portion including 256B of data. Each portion of the page of data may correspond with one or more flag bits.

Figure 6C:
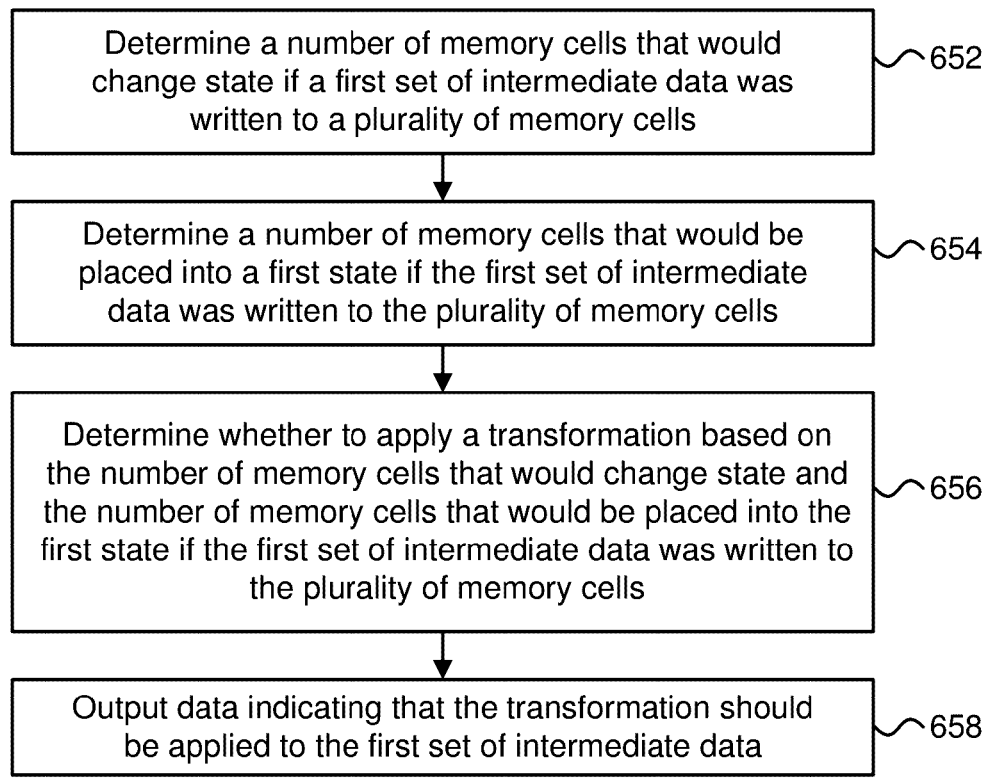
FIG. 6C is a flowchart describing one embodiment of a process for determining whether to apply a transformation to a first set of intermediate data prior to programming the first set of intermediate data.

FIG. 6C is a flowchart describing one embodiment of a process for determining whether to apply a transformation to a first set of intermediate data prior to programming. The process described in FIG. 6C is one example of a process for implementing step 606 in FIG. 6A or for implementing step 626 in FIG. 6B. In one embodiment, the process of FIG. 6C may be performed by a memory system, such as memory system 101 in FIG. 1A.

In step 652, a number of memory cells that would change state given that a first set of intermediate data was written to a plurality of memory cells is determined. In step 654, a number of memory cells that would be placed into a first state if the first set of intermediate data was written to the plurality of memory cells is determined. In step 656, it is determined whether to apply a transformation to the first set of intermediate data based on the number of memory cells that would change state and the number of memory cells that would be placed into the first state if the first set of intermediate data was written to the plurality of memory cells. In step 658, data indicating that the transformation should be applied to the first set of intermediate data is outputted.

In one embodiment, the transformation may correspond with inverting the first set of intermediate data. In one example, the transformation may be applied to the first set of intermediate data if the number of memory cells that would change state is greater than half the number of the plurality of memory cells. In another example, the transformation may be applied to the first set of intermediate data if the number of memory cells that would be placed into the first state is greater than a threshold (e.g., more than 55% of the plurality of memory cells would be placed into the first state). The first state may correspond with a lowest resistance state of a memory cell. The first state may corresponds with the highest leakage current state for a memory cell. In another example, the transformation may be applied to the first set of intermediate data based on a joint optimization between the number of memory cells that would change state and the number of memory cells that would be placed into one or more of the lowest resistance states (e.g., the two lowest resistance states).

Figure 6D:
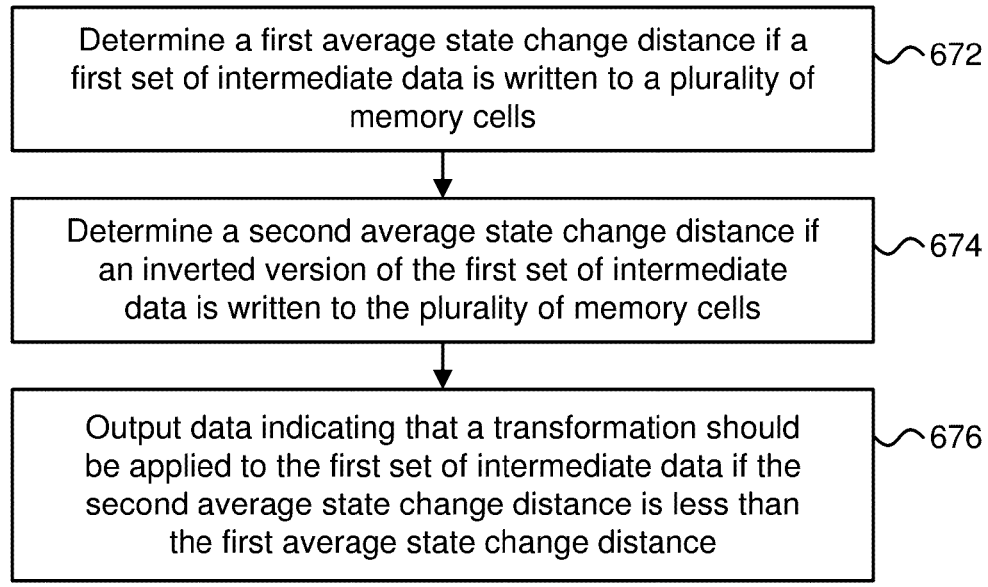
FIG. 6D is a flowchart describing an alternative embodiment of a process for determining whether to apply a transformation to a first set of intermediate data prior to programming the first set of intermediate data.

FIG. 6D is a flowchart describing an alternative embodiment of a process for determining whether to apply a transformation to a first set of intermediate data prior to programming. The process described in FIG. 6D is one example of a process for implementing step 606 in FIG. 6A or for implementing step 626 in FIG. 6B. In one embodiment, the process of FIG. 6D may be performed by a memory system, such as memory system 101 in FIG. 1A.

In step 672, a first average state change distance given that a first set of intermediate data would be written to a plurality of memory cells is determined. In step 674, a second average state change distance given that an inverted version of the first set of intermediate data would be written to the plurality of memory cells is determined. In step 676, data indicating that a transformation should be applied to the first set of intermediate data is outputted if the second average state change distance is less than the first average state change distance. In one example, if a plurality of memory cells comprised eight 2-bit per cell memory cells and writing a first set of intermediate data into the plurality of memory cells would cause four of the memory cells to move from the lowest resistance state to the highest resistance state and four of the memory cells to move from the resistance state below the highest resistance state to the resistance state above the lowest resistance state, then the average state change distance would be (3*4+1*4)/8=2.

Figure 7:
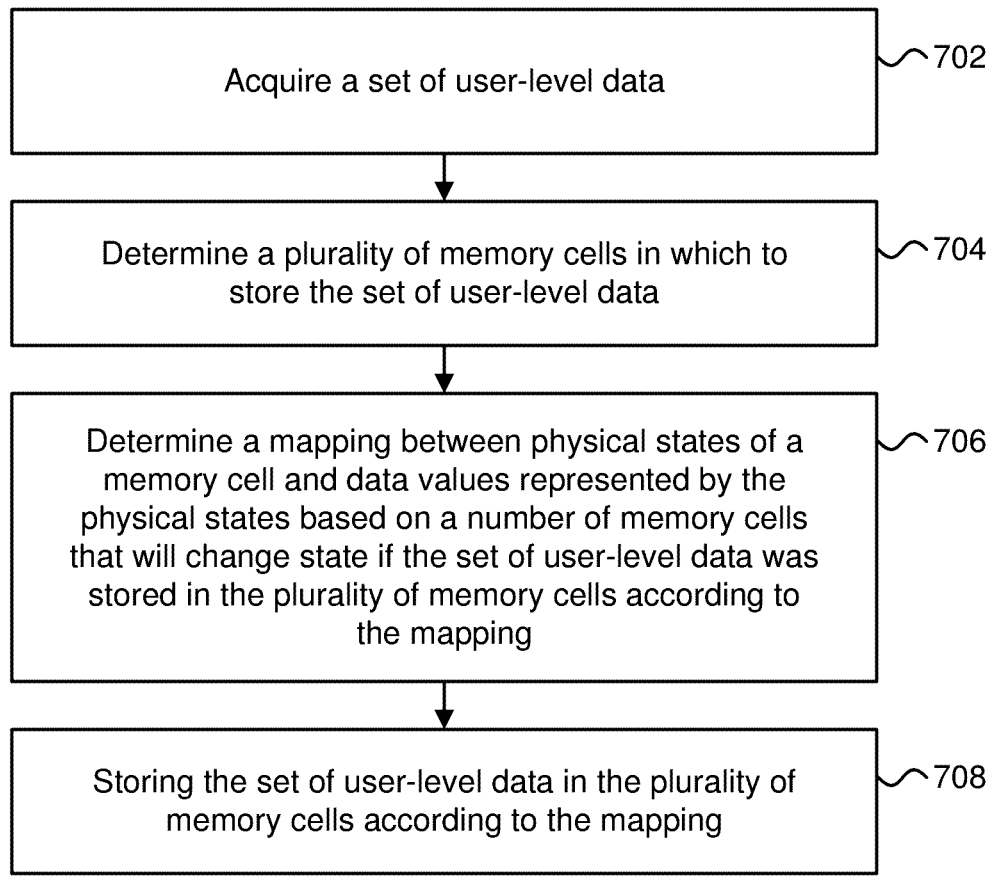
FIG. 7 is a flowchart describing another embodiment of a process for performing a programming operation.

FIG. 7 is a flowchart describing another embodiment of a process for performing a programming operation. In one embodiment, the process of FIG. 7 may be performed by a memory system, such as memory system 101 in FIG. 1A.

In step 702, a set of user-level data is acquired. The set of user-level data may be acquired from a host, such as host 106 in FIG. 1A. The set of user-level data may comprise user data that is input to a non-volatile storage system. In one example, the set of user-level data may be provided to the non-volatile storage system along with a write command to store the set of user-level data within the non-volatile storage system.

In step 704, a plurality of memory cells in which to store the set of user-level data is determined. In one embodiment, a non-volatile storage system may determine the plurality of memory cells based on a write address provided to the non-volatile storage system along with a write command. Within the non-volatile storage system, the write address may be decoded to identify a particular word line associated with the plurality of memory cells. In some cases, the non-volatile storage system may read word line defect information stored within the non-volatile storage system to identify whether the particular word line has been marked as a defective word line and has been remapped to a non-defective word line. Each memory cell of the plurality of memory cells may comprise a multi-level memory cell.

In step 706, a mapping between physical states of the memory cell and data values represented by the physical states is determined. The mapping may be determined based on a number of memory cells that will change state if the set of user-level data was stored in the plurality of memory cells according to the mapping. In one embodiment, a first set of intermediate data derived from the set of user-level data may be acquired and the number of memory cells that will change state if the set of user-level data was stored in the plurality of memory cells according to the mapping may be determined by determining the number of memory cells that will change state if the first set of intermediate data was written to the plurality of memory cells. In one example, the number of memory cells that will change state if the first set of intermediate data was written to the plurality of memory cells may be determined by XORing the first set of intermediate data with data stored in the plurality of memory cells and counting the number of "1"s.

In another embodiment, the mapping may be determined based on a number of memory cells that will change state if the set of user-level data was stored in the plurality of memory cells according to the mapping and on a second number of memory cells that would be placed into a particular state if the set of user-level data was stored in the plurality of memory cells according to the mapping. The particular state may comprise the lowest resistance state for a memory cell or a state associated with the highest leakage current for a memory cell.

In step 708, the set of user-level data is stored in the plurality of memory cells according to the mapping. In one embodiment, storing the set of user-level data in the plurality of memory cells according to the mapping may include inverting a first set of intermediate data derived from the set of user-level data and writing the inverted set of intermediate data to the plurality of memory cells.

In some cases where the plurality of memory cells comprise multi-level memory cells, a mapping that minimizes the number of memory cells that will change state if the set of user-level data was stored in the plurality of memory cells according to the mapping may be used. In one example, the mapping may correspond with "00" being assigned to the lowest resistance state, "01" being assigned to the resistance state above the lowest resistance state, "11" being assigned to the resistance state below the highest resistance state, and "10" being assigned to the highest resistance state. In other cases, a mapping that minimizes the number of memory cells that will be placed into a particular state if the set of user-level data was stored in the plurality of memory cells according to the mapping may be used. In this case, the mapping may correspond with "00" being assigned to the lowest resistance state, "01" being assigned to the resistance state above the lowest resistance state, "10" being assigned to the resistance state below the highest resistance state, and "11" being assigned to the highest resistance state.

One embodiment of the disclosed technology includes acquiring a set of user-level data to be stored in a plurality of memory cells, determining a mapping between physical states of a memory cell and data values represented by the physical states based on a number of memory cells that will change state if the set of user-level data was stored in the plurality of memory cells according to the mapping, and storing the set of user-level data in the plurality of memory cells according to the mapping.

One embodiment of the disclosed technology includes a plurality of memory cells and one or more managing circuits in communication with the plurality of memory cells. The one or more managing circuits acquire a set of user-level data to be stored in the plurality of memory cells and determine a mapping between physical states of a memory cell and data values represented by the physical states based on a number of memory cells that will change state if the set of user-level data was stored in the plurality of memory cells according to the mapping. The one or more managing circuits cause the set of user-level data to be stored in the plurality of memory cells according to the mapping.

One embodiment of the disclosed technology includes acquiring a first set of intermediate data to be written to a plurality of memory cells, determining a number of memory cells that will change state if the first set of intermediate data was written to the plurality of memory cells, determining a first transformation to apply to the first set of intermediate data based on the number of memory cells that will change state if the first set of intermediate data was written to the plurality of memory cells, generating a second set of intermediate data by applying the first transformation to the first set of intermediate data, and writing the second set of intermediate data to the plurality of memory cells.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and may not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a non-volatile storage system, comprising:
   acquiring a set of user-level data to be stored in a plurality of memory cells;
   acquiring a first set of intermediate data derived from the set of user-level data;
   determining a number of memory cells that will change state if the first set of intermediate data was written to the plurality of memory cells;
   determining a second number of memory cells that would be placed into a first state if the first set of intermediate data was written to the plurality of memory cells;
   determining a mapping between physical states of a memory cell and data values represented by the physical states based on the number of memory cells that will change state if the first set of intermediate data was written to the plurality of memory cells and on the second number of memory cells that would be placed into the first state; and
   storing the set of user-level data in the plurality of memory cells according to the mapping.

2. The method of claim 1, wherein:
   the determining the number of memory cells that will change state if the first set of intermediate data was written to the plurality of memory cells includes reading a current set of intermediate data written in the plurality of memory cells and comparing the current set of intermediate data with the first set of intermediate data.

3. The method of claim 1, wherein:
   the storing the set of user-level data in the plurality of memory cells according to the mapping includes inverting the first set of intermediate data and writing the inverted first set of intermediate data to the plurality of memory cells.

4. The method of claim 1, wherein:
   the storing the set of user-level data in the plurality of memory cells according to the mapping includes inverting the first set of intermediate data if the number of memory cells that will change state if the first set of intermediate data was written to the plurality of memory cells is greater than half of the plurality of memory cells.

5. The method of claim 1, wherein:
   each memory cell of the plurality of memory cells comprises a multi-level memory cell.

6. A non-volatile storage system, comprising:
   a plurality of memory cells; and
   one or more managing circuits in communication with the plurality of memory cells, the one or more managing circuits configured to acquire a set of user-level data to be stored in the plurality of memory cells and acquire a first set of intermediate data derived from the set of user-level data, the one or more managing circuits configured to determine a number of memory cells that will change state if the first set of intermediate data was written to the plurality of memory cells and determine a second number of memory cells that would be placed into a first state if the first set of intermediate data was written to the plurality of memory cells, the one or more managing circuits configured to determine a mapping between physical states of a memory cell and data values represented by the physical states based on the number of memory cells that will change state if the first set of intermediate data was written to the plurality of memory cells and on the second number of memory cells that would be placed into the first state, the one or more managing circuits configured to cause the set of user-level data to be stored in the plurality of memory cells according to the mapping.

7. The non-volatile storage system of claim 6, wherein:
the one or more managing circuits configured to read a current set of intermediate data written in the plurality of memory cells and determine the number of memory cells that will change state based on a comparison of the current set of intermediate data and the first set of intermediate data.

8. The non-volatile storage system of claim 6, wherein:
the one or more managing circuits configured to invert the first set of intermediate data and write the inverted first set of intermediate data to the plurality of memory cells.

9. The non-volatile storage system of claim 6, wherein:
the one or more managing circuits configured to invert the first set of intermediate data if the number of memory cells that will change state if the first set of intermediate data was written to the plurality of memory cells is greater than half of the plurality of memory cells.

10. A method for operating a non-volatile storage system, comprising:
acquiring a first set of intermediate data to be written to a plurality of memory cells;
determining a number of memory cells that will change state if the first set of intermediate data was written to the plurality of memory cells;
determining a first transformation to apply to the first set of intermediate data based on the number of memory cells that will change state if the first set of intermediate data was written to the plurality of memory cells;
determining a second number of memory cells that would be placed into a first state if the first set of intermediate data was written to the plurality of memory cells, the determining a first transformation includes determining the first transformation based on the number of memory cells that will change state if the first set of intermediate data was written to the plurality of memory cells and on the second number of memory cells that would be placed into the first state;
generating a second set of intermediate data by applying the first transformation to the first set of intermediate data; and
writing the second set of intermediate data to the plurality of memory cells.

11. The method of claim 10, wherein:
the first transformation includes inverting the first set of intermediate data.

12. The method of claim 10, wherein:
the first transformation comprises inverting the first set of intermediate data if the number of memory cells that will change state if the first set of intermediate data was written to the plurality of memory cells is greater than half of the plurality of memory cells.

13. The method of claim 10, wherein:
the determining a number of memory cells that will change state includes determining a current set of intermediate data written in the plurality of memory cells and comparing the current set of intermediate data with the first set of intermediate data.

14. The method of claim 10, wherein:
the first state corresponds with a lowest resistance state for a memory cell.

15. The method of claim 10, wherein:
the determining a first transformation includes determining a first average state change distance given that the first set of intermediate data is written to the plurality of memory cells, determining a second average state change distance given that an inverted version of the first set of intermediate data is written to the plurality of memory cells, and determining the first transformation based on the first average state change distance and the second average state change distance.

16. The method of claim 15, wherein:
the first transformation comprises inverting the first set of intermediate data if the second average state change distance is less than the first average state change distance.

17. The method of claim 10, wherein:
each memory cell of the plurality of memory cells comprises a multi-level memory cell.

18. The method of claim 10, wherein:
the non-volatile storage system includes a non-volatile memory including the plurality of memory cells, the non-volatile memory is monolithically formed in one or more physical levels of memory cells having active areas disposed above a silicon substrate.

* * * * *